(12) United States Patent
Guo et al.

(10) Patent No.: US 9,065,237 B2
(45) Date of Patent: Jun. 23, 2015

(54) HIGH-BRIGHTNESS SPATIAL-MULTIPLEXED MULTI-EMITTER PUMP WITH TILTED COLLIMATED BEAM

(75) Inventors: James Yonghong Guo, Fremont, CA (US); Jay A. Skidmore, San Jose, CA (US); Lei Xu, San Jose, CA (US); Jane Cheng, San Ramon, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 568 days.

(21) Appl. No.: 13/313,490

(22) Filed: Dec. 7, 2011

(65) Prior Publication Data

US 2013/0148684 A1    Jun. 13, 2013

(51) Int. Cl.
| | |
|---|---|
| *H01S 5/02* | (2006.01) |
| *H01S 5/40* | (2006.01) |
| *H01S 5/022* | (2006.01) |
| *H01S 5/00* | (2006.01) |

(52) U.S. Cl.
CPC ............ *H01S 5/02252* (2013.01); *H01S 5/005* (2013.01); *H01S 5/4012* (2013.01); *H01S 5/4043* (2013.01)

(58) Field of Classification Search
CPC . H01S 5/02252; H01S 5/4031; H01S 5/4043; H01S 5/4068
USPC ...................................... 372/50.12
See application file for complete search history.

(56) References Cited

U.S. PATENT DOCUMENTS

| | | | |
|---|---|---|---|
| 5,333,077 A | 7/1994 | Legar et al. ................... 359/619 |
| 5,987,043 A | 11/1999 | Brown et al. ................... 372/36 |
| 6,124,973 A | 9/2000 | Du et al. ....................... 359/618 |
| 6,160,664 A | 12/2000 | Du et al. ....................... 359/628 |
| 6,377,410 B1 | 4/2002 | Wang et al. ................... 359/837 |
| 6,556,352 B2 | 4/2003 | Wang et al. ................... 359/641 |
| 6,680,800 B1 | 1/2004 | Schreiber et al. ............. 359/618 |
| 6,683,727 B1 * | 1/2004 | Goring et al. ................. 359/639 |
| 6,993,059 B2 | 1/2006 | Anikitchev et al. ........... 372/106 |
| 7,035,014 B2 | 4/2006 | Mikhailov et al. ............ 359/641 |
| 7,586,961 B2 | 9/2009 | Alcock et al. ............ 372/29.015 |
| 7,693,206 B2 | 4/2010 | Zheng et al. ............... 372/50.23 |
| 7,773,653 B2 | 8/2010 | Voss et al. .................. 372/50.12 |
| 7,830,608 B2 | 11/2010 | Hu et al. ....................... 359/641 |
| 7,830,945 B2 | 11/2010 | Nagano et al. ................ 372/101 |
| 7,848,372 B2 * | 12/2010 | Schulte et al. .................. 372/36 |
| 7,965,910 B2 | 6/2011 | Klimek et al. .................. 385/18 |
| 2005/0254539 A1 | 11/2005 | Klimek ...................... 372/50.12 |

* cited by examiner

*Primary Examiner* — Tod T Van Roy
*Assistant Examiner* — Marcia Golub-Miller
(74) *Attorney, Agent, or Firm* — JDS Uniphase Corporation

(57) ABSTRACT

Multi-mode diode emitters are stacked in a staircase formation to provide a spatially-multiplexed output. Improved coupling efficiency is achieved by providing tilted collimated output beams that determine an effective step height of the stepped structure. Since the effective step height is dependent on the tilt angle, a variable number of emitters can be used inside packages having a same physical step height, while still attaining high coupling efficiency.

25 Claims, 12 Drawing Sheets

US 9,065,237 B2

HIGH-BRIGHTNESS SPATIAL-MULTIPLEXED MULTI-EMITTER PUMP WITH TILTED COLLIMATED BEAM

CROSS-REFERENCE TO RELATED APPLICATIONS

Not Applicable.

MICROFICHE APPENDIX

Not Applicable.

TECHNICAL FIELD

The present application relates generally to laser diode arrays and in particular to high-brightness spatial-multiplexed multi-emitter pumps with tilted collimated beams.

BACKGROUND OF THE INVENTION

Laser diodes are used in many applications including materials processing, medical devices, telecommunications, printing, etc. In many of these applications, and in particular those in which laser diodes are used to optically excite or "pump" the gain media of other lasers, the laser diodes are aligned along a common substrate at regular intervals to form a row or strip of diode emitters. These laser diode bars provide a relatively high brightness.

For example, referring to FIG. 1, there is shown a perspective view of a prior art laser diode bar 100. In this example, the diode bar includes ten diode emitters 102. Each diode bar typically has a width 110 that is approximately 150 microns along an axis 116 that is perpendicular to an axis 112 of the diode bar stripe. The diode bar 100 emits a combined output from the combined emitting areas of the individual diode emitters 102. Each diode emitter 102 typically has an area with a width 108 and length 106 that are, for example, one micron and 100 microns, respectively.

Output beams 104 produced by the individual diode emitters 102 along an output axis 114 have a relatively broad angular divergence in one direction or axis 118 and a smaller degree of divergence in the orthogonal direction or axis 120. These axes are often referred to as the "fast" and "slow" axes, 118 and 120, respectively.

To provide increased brightness traditional multi-emitter pumps have been typically fabricated by stacking laser diode bars to form stacked laser diode bar assemblies (e.g., up to about 50 laser diode bars in one stack). More specifically, the beams emitted from the different diodes are collected in the same space to provide a spatial multiplexed output having a relatively high brightness. One example of a stacked laser diode bar assembly is shown in FIG. 2, wherein the slow axes are stacked above each other. More specifically, FIG. 2 shows a perspective view of a stack 300 of diode bars 301 with emitters 302 mounted in between cooling slabs 330 in a modular arrangement. Cooling passages or channels 332 and 334 are provided for liquid heat transfer. Spacers 340 are optionally provided to facilitate alignment of the diode bars 301 and cooling slabs 330.

One limitation of the attainable brightness of stacked laser bar assemblies, such as 300, is the spacing or "pitch" between laser bars in the particular stack. Referring to Eq. 1, the brightness B of a given light source, for example a laser diode or diode bar 301, is described as:

$$B = P/(A \cdot \Omega) \quad (1)$$

where, P is the power output of the particular light source, $\Omega$ is the solid angle of the beam divergence, and A is the area of the light source. The brightness of a given light source consequently includes a power component, an area component and a divergence component. Typical units of measure are Watts for P, steradians (ster) for $\Omega cm^2$ for A, and Watts/$cm^2$/ster for B.

Eq. 1 shows that the brightness of a laser diode stack is reduced by the percentage of non-light-emitting area of the structure outside the diode emitters. The ratio of the total emitter area compared to the total area of a stack is sometimes referred to as the fill factor of the diode stack. In order to increase the fill factor and still provide convenient heat removal (i.e., from cooling slabs) laser diode bars have been provided on stepped support structures. For example, referring to FIG. 3 there is shown a side view of an embodiment 500 of a stacked array. The stacked array 500 includes two or more laser diode bars 502, with each positioned on a support structure 514 in a stacked relation to adjacent diode bars. The support structure 514 includes a substrate or support surface 504 and has steps 503 that support the diode bars 502. The support surface 504 acts as a heat spreader or conductor. The steps 503 typically also support one or more optics (not shown) for collimating the beams emitted from the emitters. For example, in one embodiment the steps 503 support a first plurality of collimating lenses (e.g., where each lens is disposed in front of an emitter) for collimating the beams along the fast axis, and second plurality of collimating lenses (e.g., where each lens is also disposed in front of the emitter, but farther down the beam's path) to collimate the beams along the slow axis. In addition, in traditional spatial-multiplexed multi-emitter designs, the collimated beam transmitted from the emitters typically is combined into an output fiber via a coupling lens. Collimated beams from individual emitters are parallel to the optical axis of the coupling lens. Furthermore, the output fiber is also aligned at the optical axis of the coupling lens.

In general, the step height (t) is influenced by the individual diode bar heights and the thickness of associated electrical or ohmic contacts. The step height (t) is related to the combined beam size in the fast axis direction (h) by:

$$h = Nt \quad (2)$$

where N is number of emitters in a row. However, while a smaller step height can combine more emitters, it may also cause beam clipping, which results in a lower coupling efficiency (CE). In fact, it is typically necessary to balance the step height with the number of emitters to attain high coupling efficiency. If the number of emitters change, the step height should be re-optimized to achieve the best coupling efficiency. Unfortunately, it is impractical to create different packages for different target power levels (i.e., different number of emitters per pump).

It would be advantageous to provide a spatial-multiplexed multi-mode emitter pump that provides high coupling efficiency for a varying number of emitters.

SUMMARY OF THE INVENTION

The instant invention relates to multi-mode diode emitters stacked in a staircase formation to provide a spatially-multiplexed output. In one embodiment, the spatial-multiplexed multi-mode single-emitter pump has a tilted collimated output beam that allows a variable number of emitters to be used inside packages having a same physical step height, while still attaining high coupling efficiency. Advantageously, the titled collimated output beam reduces feedback from the optical components, thus increasing the reliability of the laser diodes.

In accordance with one aspect of the instant invention there is provided a multi-emitter pump comprising: a package base; a laser diode assembly supported on the package base, the laser diode assembly including a stepped support structure including first, second, and third steps, the first step supporting a first laser diode emitter and a first collimating lens, the second step supporting a second laser diode emitter and a second collimating lens, the third step supporting a third laser diode emitter and a third collimating lens; an at least one coupling lens mounted on the package base for directing collimated light transmitted from the laser diode assembly to an output port; wherein the laser diode assembly is arranged to transmit beams of light emitted from each of the first, second, and third laser diode emitters to the at least one coupling lens as tilted collimated beams of light that are incident on the at least one coupling lens with a non-zero angle of incidence, each of the tilted collimated beams of light having the same tilt angle relative to a supporting surface of the package base.

In accordance with another aspect of the instant invention there is provided a method of providing a spatial-multiplexed beam of light comprising: providing a laser diode assembly on a package base, the laser diode assembly including a stepped support structure having first, second, and third steps, the first step supporting a first laser diode emitter and a first collimating lens, the second step supporting a second laser diode emitter and a second collimating lens, the third step supporting a third laser diode emitter and a third collimating lens; and mounting at least one coupling lens on the package base, the at least one coupling lens for directing collimated light transmitted from the laser diode assembly to an output port; wherein the laser diode assembly is arranged to transmit beams of light emitted from each of the first, second, and third laser diode emitters to the at least one coupling lens as tilted collimated beams of light that are incident on the at least one coupling lens with a non-zero angle of incidence, each of the tilted collimated beams of light having the same tilt angle relative to a supporting surface of the package base.

In accordance with another aspect of the instant invention there is provided a multi-emitter pump comprising: a package base; a laser diode assembly supported on the package base, the laser diode assembly including a stepped support structure including first, second, and third steps, the first step supporting a first laser diode emitter and a first collimating lens, the second step supporting a second laser diode emitter and a second collimating lens, the third step supporting a third laser diode emitter and a third collimating lens; and at least one coupling lens mounted on the package base for directing collimated light transmitted from the laser diode assembly to an output port; wherein the laser diode assembly is arranged to transmit beams of light emitted from each of the first, second, and third laser diode emitters to the at least one coupling lens as tilted collimated beams of light that are at an angle to a plane perpendicular to the stepping direction of the stepped support structure, each of the tilted collimated beams of light having the same tilt angle relative to a supporting surface of the package base.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

The instant invention relates to spatial-multiplexed multi-emitter pumps. In one embodiment, the laser diode emitters are stacked in a staircase formation to provide a spatially-multiplexed output wherein the pump includes a tilted collimated output beam that allows a variable number of emitters to be used inside packages having a same step height, while still attaining high coupling efficiency.

For a stack having a single row of emitters, the output power of the pump is determined by the number of diodes (N) times the coupling efficiency (CE). The CE is a function of the numerical aperture (NA) of the output fiber, the core diameter of the output fiber (e.g., which is determined by the application), combined beam size (h), and beam clipping (e.g., which is function of step height (t)). By decreasing step height (t), more emitters can be combined, but beam clipping increases. Accordingly, CE is function of the number of emitters and the step height for a given output fiber.

Figure 1:
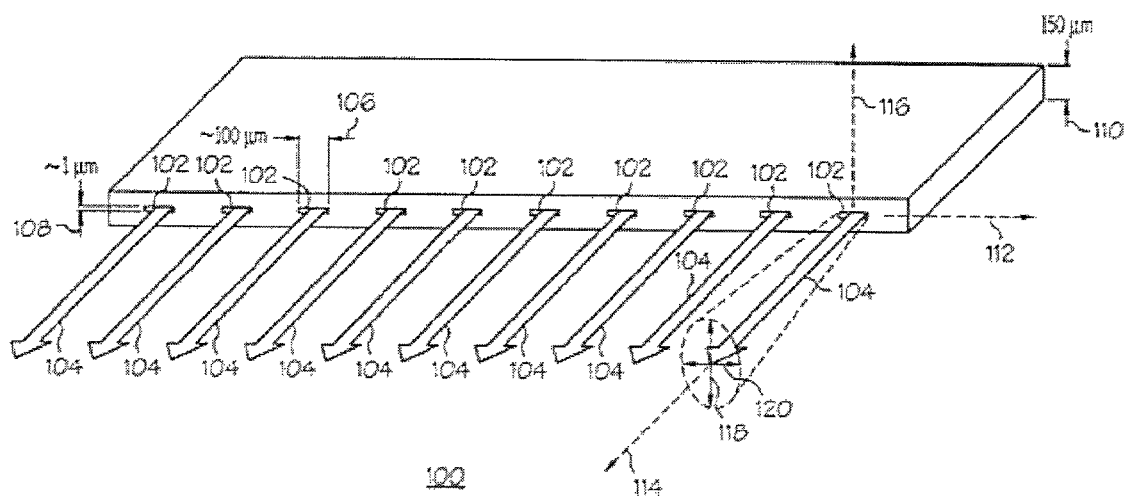
FIG. 1 is a schematic diagram of a prior art laser diode bar.
Figure 2:
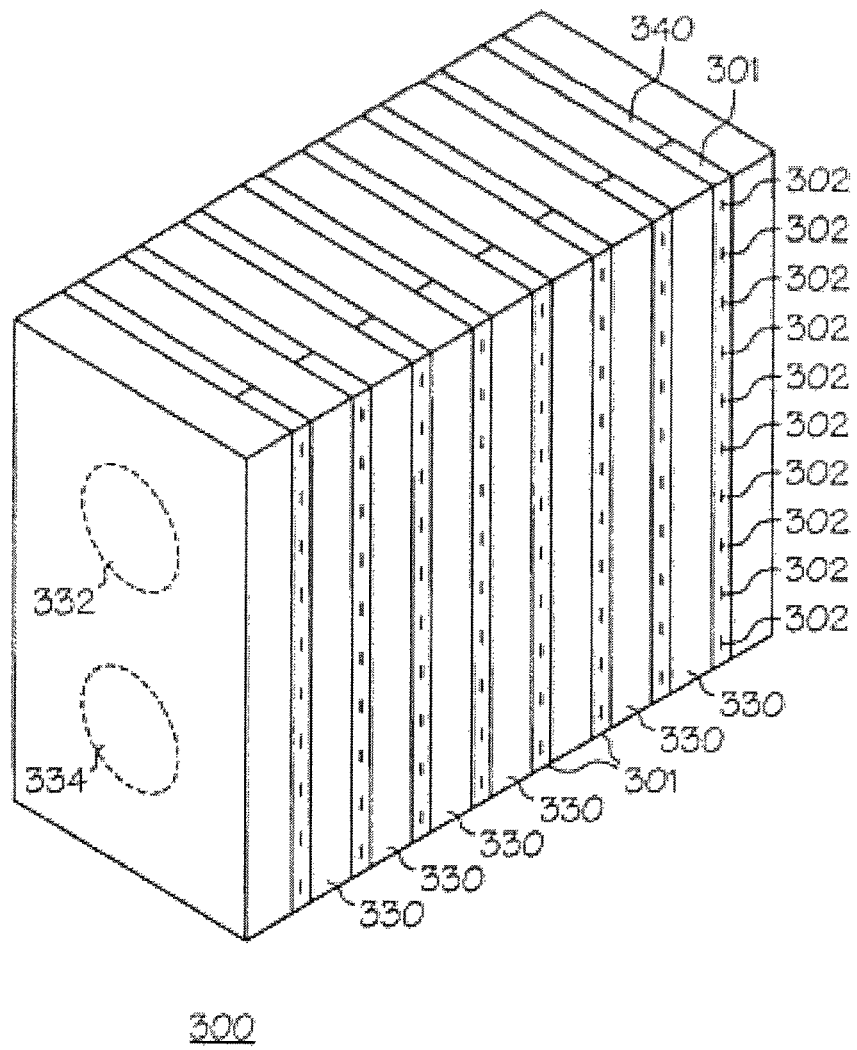
FIG. 2 is a schematic diagram of a prior art stack of laser diode bars.
Figure 3:
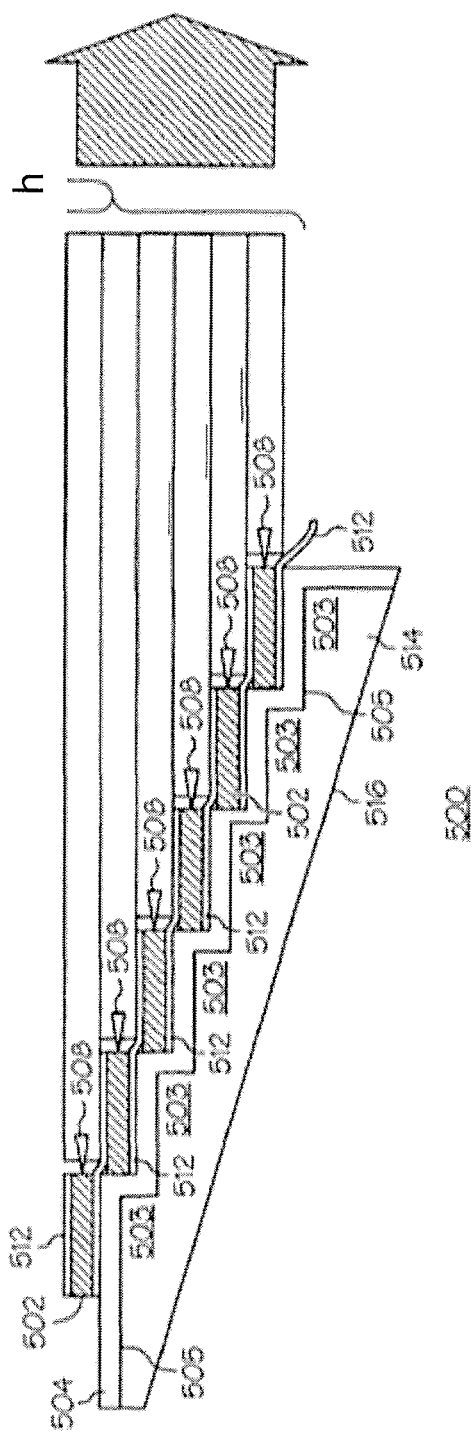
FIG. 3 is a schematic diagram of a prior art stack of laser diode bars stacked in a staircase formation.
Figure 4:
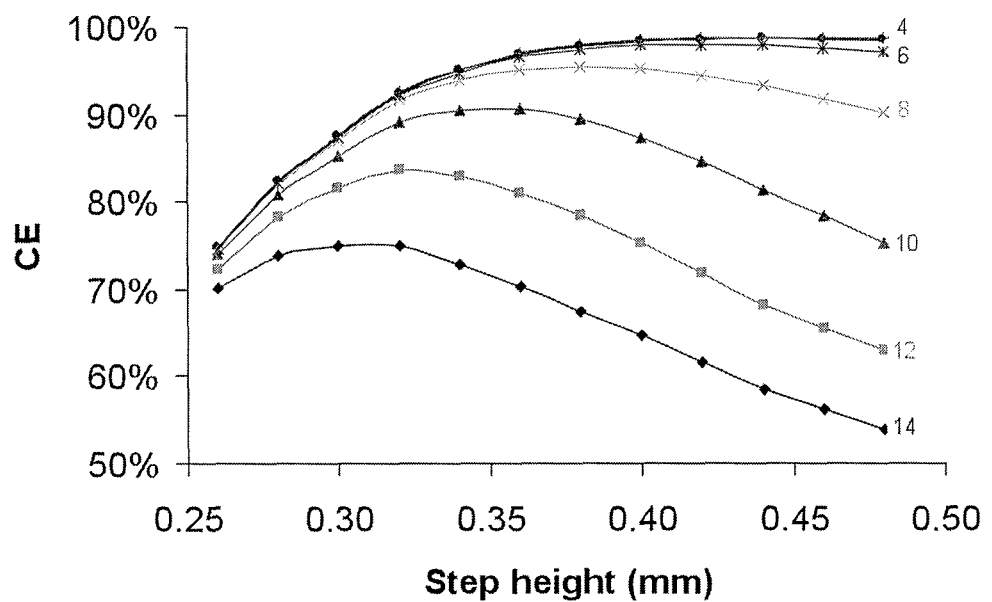
FIG. 4 is a plot of coupling efficiency as a function of step height.

The CE as a function of step height has been calculated, and is shown in FIG. 4 for a varying number of emitters. In the calculations, it was assumed that the module operates at a constant drive current and that the fast axis collimator (FAC), slow axis collimator (SAC), coupling lens (CL), diode near field (NF) and diode far field (FF) are constant. In addition, it was assumed that the numerical aperture (NA) of the output fiber was 0.15 and that the fiber core has a diameter of 105 um.

Referring to FIG. 4, the advantages of balancing the step height with the number of emitters to attain high coupling efficiency is evident. More specifically, it is clear that a lower step height provides optimum coupling efficiency for a relatively high number of emitters (e.g., 10-12), whereas a higher step height provides optimum coupling efficiency for a relatively low number of emitters (e.g., 4-6).

In general, for a given diode, the CE will increase as the step height increases because more light will be integrated over the fast-axis (FA) full angle (approximately Gaussian distribution). However, once the step height is increased so that the combined beam size h is equal to N*t=NA*CL, any further increase in step height will exceed the maximum NA allowed by the fiber. Accordingly, the step height t is generally limited (i.e., t<NA*CL/N). Further increases in step height beyond this value leads to monotonically decreasing CE (e.g., N=14 emitters in a single row). For a small number of emitters (e.g., N=4) the maximum NA is not yet reached with larger step height so maximum CE does not reach the maximum theoretical value. Accordingly, for good optimization of CE (and corresponding optical-optical efficiency of the pumped fiber laser) the step height should be adjusted as the number of emitters coupled is increased or decreased. Unfortunately, it is more costly to provide various packages/support structures with different physical step heights.

In accordance with one embodiment of the instant invention, coupling efficiency is optimized by introducing beam tilting to alter the effective step height ($t_e$) while keeping the physical step height (t) constant so that the same package/stepped support structure is used for a different number of emitters, while still providing optimum coupling efficiency.

Figure 5A:
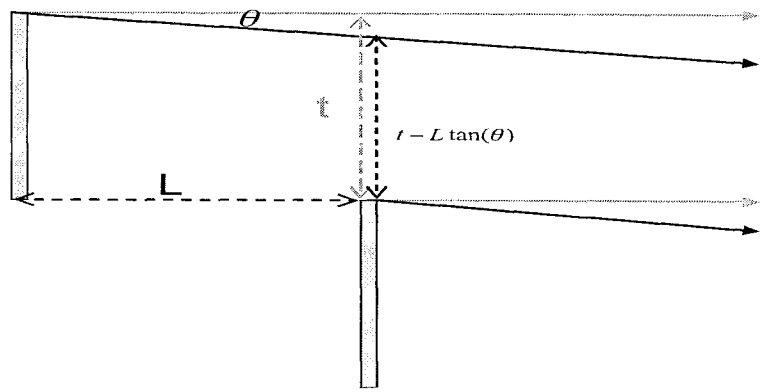
FIG. 5a is a schematic diagram illustrating beam tilting in accordance with one embodiment of the instant invention.
Figure 5B:
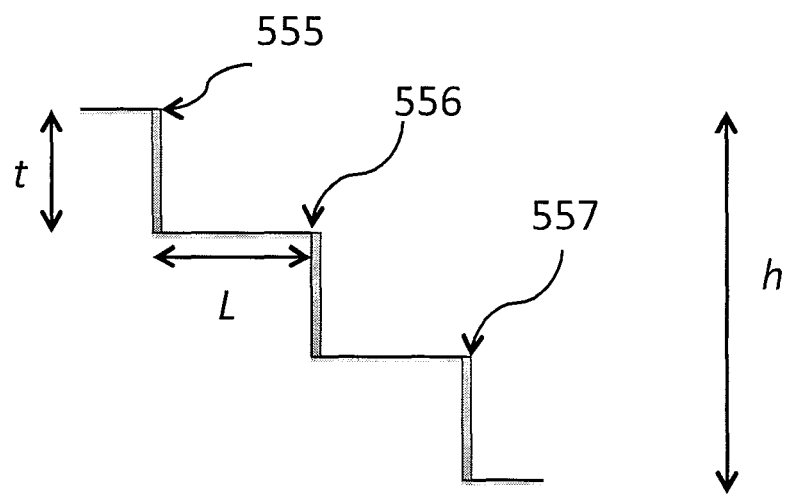
FIG. 5b is a schematic diagram illustrating a laser diode assembly in accordance with one embodiment of the instant invention having three laser diode emitters.

Referring to FIG. 5a, the effective step height ($t_e$) is given as:

$$t_e = t - L \tan(\theta) \quad (3)$$

where L is the distance between adjacent diodes/mirrors (e.g., shown as the step length) and θ is the angle that beam is tilted (e.g., relative to the optic axis of coupling lens). Referring also to FIG. 5b, which shows an array of three emitters 555, 556, 557, the distance between adjacent diodes/mirrors corresponds to the difference in distance that light emitted from adjacent emitters will travel before reaching the coupling lens.

In general, the beams will be tilted relative to the optical axis of a coupling system that converges the collimated beams of light at a single output port. More specifically, the beams will be tilted out of a plane perpendicular to the stepping direction (i.e., the stepping direction is the direction that the steps rise in, as for example, used to determine step height). As a result of the beam tilting, the fiber tail assembly (FTA) typically will be displaced up or down relative to the optical axis of the coupling lens as follows:

$$\Delta S_{FTA} = f_{cl} \tan(\theta) \quad (4)$$

where $f_{cl}$ is focal length of coupling lens.

Figure 6:
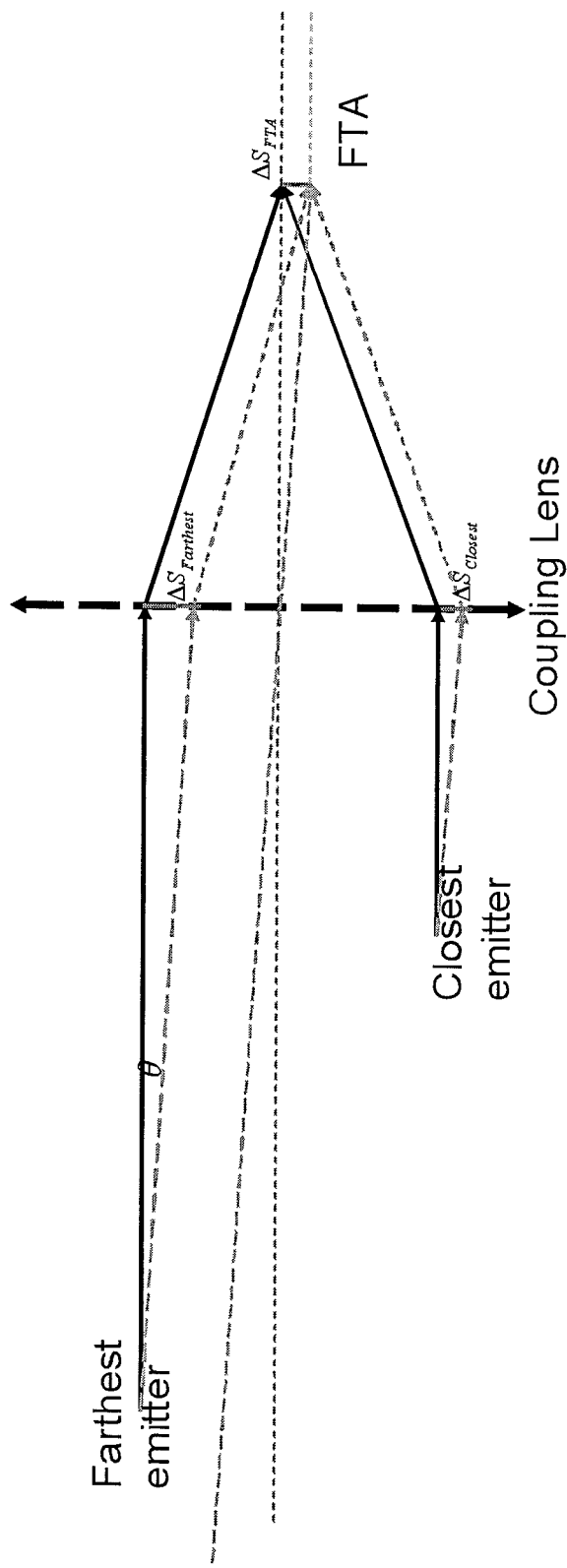
FIG. 6 is a schematic diagram of an optical train illustrating the effects of beam tilting on the numerical aperture of the system.

One embodiment of an optical train illustrating the displacement of the FTA input is shown in FIG. 6 (e.g., shown as a vertical displacement). When light beams parallel to the optical axis of the coupling lens are emitted from the farther emitter and/or the closest emitter, the FTA will generally be disposed such that it is centered on the optical axis (e.g., about one focal length away from the coupling lens). When the beam is tilted with an angle θ relative to the optical axis of the coupling lens so that it is angled down or up relative to the optic axis of the lens the FTA will generally be translated either down or up, respectively, in order to improve coupling efficiency.

In order to reduce effective step height $t_e$ the FTA must be moved down further relative to the emitters, as shown in FIG. 6. More specifically, since the vertical displacement of angled ray from the farthest emitter at the focusing lens is larger than the corresponding displacement shown for the closest emitter, the position of the FTA will be dependent on the position of the emitters.

In the embodiment illustrated in FIG. 6, the beam from each emitter is angled downwards by a same fixed angle θ. As a result, the final NA of the system (e.g., illustrated with dashed lines) is smaller than an embodiment with a parallel configuration. In accordance, with another embodiment of the instant invention (not shown), the collimated light beams are angled upwards so that the final NA outlined by the dashed lines is larger than that obtained with a parallel configuration (i.e., where light is incident on the coupling lens at normal incidence).

For each emitter, the NA change of the combined beam due to beam tilting is given as:

$$\Delta NA_{emitter} = \frac{\Delta S_{emitter}}{f_{cl}} \quad (5)$$
$$= \frac{\Delta FTA - \tan(\theta) L_{emitter}}{f_{cl}}$$
$$= \tan(\theta) \frac{f_{cl} - L_{emitter}}{f_{cl}}$$

For the entire system, the NA change due to beam tilting is:

$$\Delta NA = \tan(\theta) \frac{L_{closest} - L_{farthest}}{f_{cl}} \quad (6)$$

where $L_{emitter}$, $L_{closest}$, and $L_{farthest}$ correspond to the distances between the coupling lens and the corresponding mirror.

In order to optimize the NA (i.e., decrease) the center point of the fiber core will be centered with respect to the beam positions corresponding to the closest and farthest diodes, and the fiber will be parallel to the optical axis of the coupling lens (e.g., the fiber is horizontal in FIG. 6 and is not tilted).

Notably, the varied $NA_{emitter}$ comes with the concomitant loss of integrated power of the fast-axis emission from the laser diode (e.g., the varied $NA_{emitter}$ will decrease or increase depending on whether the effective step height $t_e$ increases or decreases). In addition, beam tilting may come with the slight penalty of Fresnel loss at the optical components.

Advantageously, the losses due to these two effects are overcome by the advantages of providing optimized CE by tilting the collimated beams. For example, in accordance with one embodiment of the instant invention the CE efficiency is optimized by tilting collimated beams from different emitters by an amount calculated in dependence on the number of emitters so that a package having a fixed step height can be used for a varying number of emitters.

Further advantageously, it has been found that since the collimated beams are emitted from a stepped structure, and thus are at different distances from the collimating lens, there is negligible impact to the CE arising from tilting the collimated beams. Providing high coupling efficiency in a pump laser has multiple benefits including facilitating high wall plug efficiency of the solid-state/fiber lasers they pump.

Further advantageously, the titled collimated output beam reduces feedback from the optical components, thus increasing the reliability of the laser diodes.

Figure 7A:
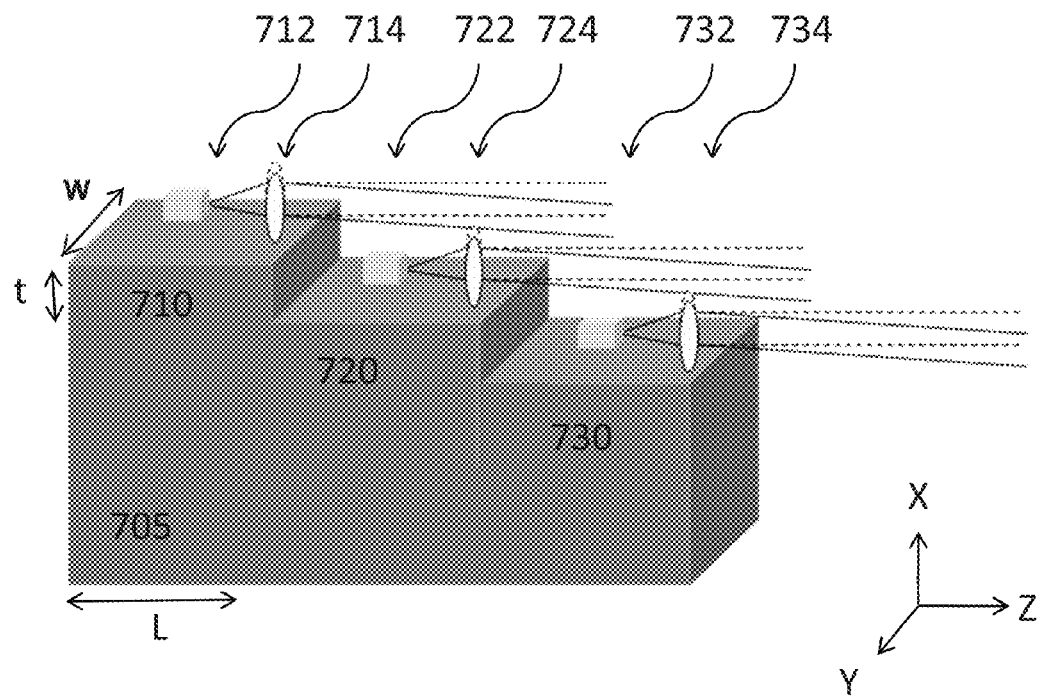
FIG. 7a is a schematic diagram of a laser diode assembly in accordance with one embodiment of the instant invention.
Figure 7B:
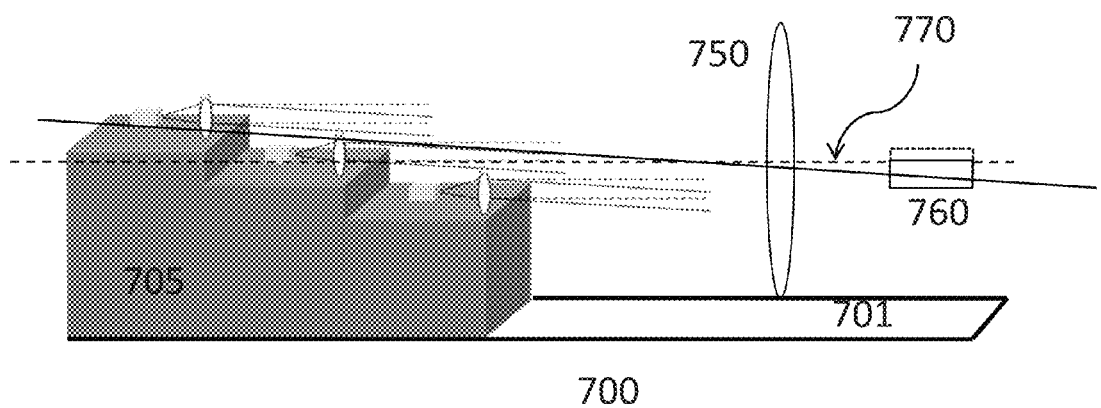
FIG. 7b is a schematic diagram of the laser diode assembly in FIG. 7a, including a coupling lens and an output port.

Referring to FIGS. 7a and 7b there is shown a schematic diagram of a laser diode assembly 700 for a spatial-multiplexed multi-emitter pump according to one embodiment of the instant invention. The assembly 700 includes a stepped support structure 705 having three steps 710, 720, 730. On each step 710, 720, 730 there is mounted a corresponding laser diode 712, 722, 732 and a fast axis collimating lens (FAC) 714, 724, 734. Optionally, a slow axis collimator (SAC) (not shown) is also mounted on each step (i.e., either before or after the FAC, but typically after). The FACs 714, 724, 734 substantially collimate the beams transmitted from the emitters and tilt the collimated beams at an angle to the system optical axis 770. The tilted collimated beams are then redirected by the coupling lens 750 and transmitted to the output port 760.

The stepped support or staircase structure 705 includes a number of steps 710, 720, 730. Each step 710, 720, and 730 has a predetermined step length L, step height t, and step width w. Optionally, the stepped support structure 705 is provided with an additional support surface and/or a cooling surface. In general, the step dimensions (e.g., t, w, L) will be determined, at least in part, on the dimensions of the laser diodes and associated connections. For example, in an embodiment using 7 laser diode emitters, the step length L is equal to 7 mm, the step height t is equal to 0.44 mm, and the step width w is equal to 14 mm. In general, the step length L is typically between 3.0 mm and 10.0 mm, the step height t is typically between 0.2 mm and 1.0 mm, and the step width w is typically between 4.0 mm and 20.0 mm.

The emitters 712, 722, 732 are typically single-emitter diodes formed from any suitable semiconductor material. Each emitter 712, 722, 732 has an optical axis that is substantially parallel to the optical axes of the other emitters and to the Z-axis. The emitters 712, 722, 732 are typically disposed such that the slow axes of the emitters are parallel to the Y-axis and the fast axes are parallel to the X-axis. The emitters 712, 722, 732 emit light as output beams that propagate along an optical axis parallel to the Z-axis. In this embodiment, each emitter 712, 722, 732 is disposed on a separate step. The pitch of the stack refers to the difference in distance between adjacent emitters (e.g., 712 and 722) in the x-direction. In general, the pitch will be equal to the step height t. Each diode 712, 722, 732 is typically mounted on the support structure using a method well known in the art.

The fast axis collimators (FACs) 714, 724, 734 are typically lenses (e.g., cylindrical lenses) that substantially collimate the output beams from the emitters in the fast axis direction (i.e., along the x-axis). In this embodiment, one FAC is provided for each emitter In general, each lens will be mounted on the stepped support structure 505 using a method well known in the art. More specifically, each lens 714, 724, 734 will be mounted such that its optical axis is offset in the fast axis direction (i.e., parallel to the x-axis). For example, in this embodiment each FAC is vertically offset so that it is not coaxial with the optical axis of the corresponding emitter. Positioning the FAC lenses such that they are offset in the fast-axis direct results in the collimated beams transmitted therefrom being tilted at an angle θ relative to the propagation axis (e.g., Z-axis). More specifically, providing an offset in the vertical direction in FIG. 7a causes the beams transmitted from the emitters to be transmitted to the coupling lens with a non-zero angle of incidence. In general, the FACs will be offset to provide a tilt θ relative to the Z-axis that is between 0 and 0.6 degrees, and more typically between 0.1 and 0.4 degrees, for light beams transmitted from each emitter (e.g., the output from each emitter is angled by the same amount). Optionally, a slow axis collimator (SAC) (not shown) is provided to collimate the beams along the slow axis. While the SAC may be disposed between the emitters and the FAC, traditionally, the SAC is disposed between the FAC and the coupling lens.

The coupling lens 750 is typically a focusing lens having a focal length f. For example, in one embodiment the coupling lens 750 is a single spherical lens. The coupling lens 750 converges the beams from the FACs and focuses them on the output port 760. In general, the coupling lens 750 will be disposed about one focal length f away from the output port, and generally, will be positioned to fit the combined beam into a numerical aperture not exceeding the NA of the output port 760. The coupling lens 750 is mounted such that its optical axis is parallel to the package base 701.

The output port 760 is typically the end of a waveguide, such as the end of an optical fiber. The optical fiber is typically mounted on the same optical bench as the coupling lens in a raised position so that the center of the optical fiber is offset from the optical axis of the lens to improve coupling efficiency (e.g., the center of the coupling lens and the center of the output fiber are at different distances from the optical bench). In general, the optical axes of both the coupling lens and the output port will be substantially parallel to the surface of the optical bench on which they are mounted.

Figure 7C:
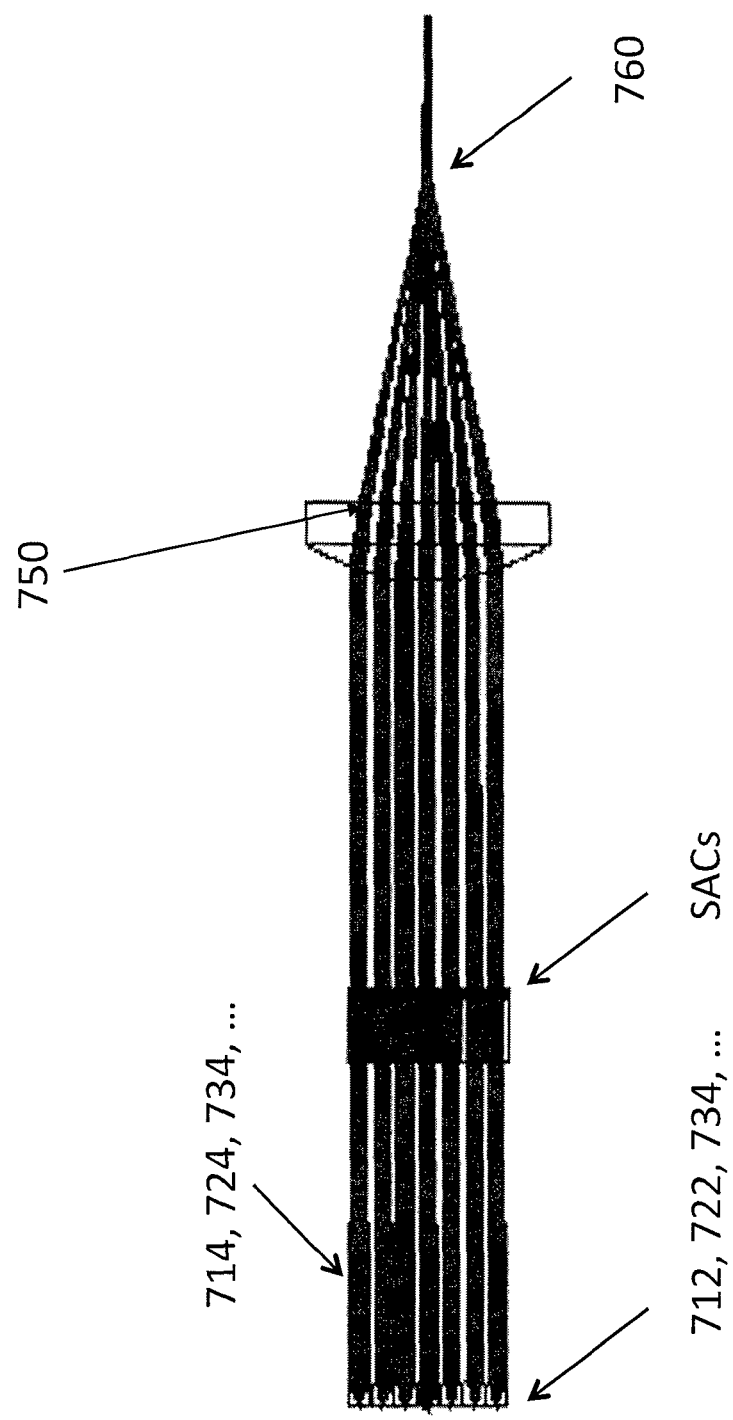
FIG. 7c is a side view of the laser diode assembly illustrated in FIG. 7b, wherein the coupling lens is a single spherical lens.

FIG. 7c shows a side view of the embodiment illustrated in FIGS. 7a and 7b, wherein the coupling lens 750 is a single spherical lens. Notably, the steps on the support structure and the angled output beams are minimized for illustrative purposes.

Figure 7D:
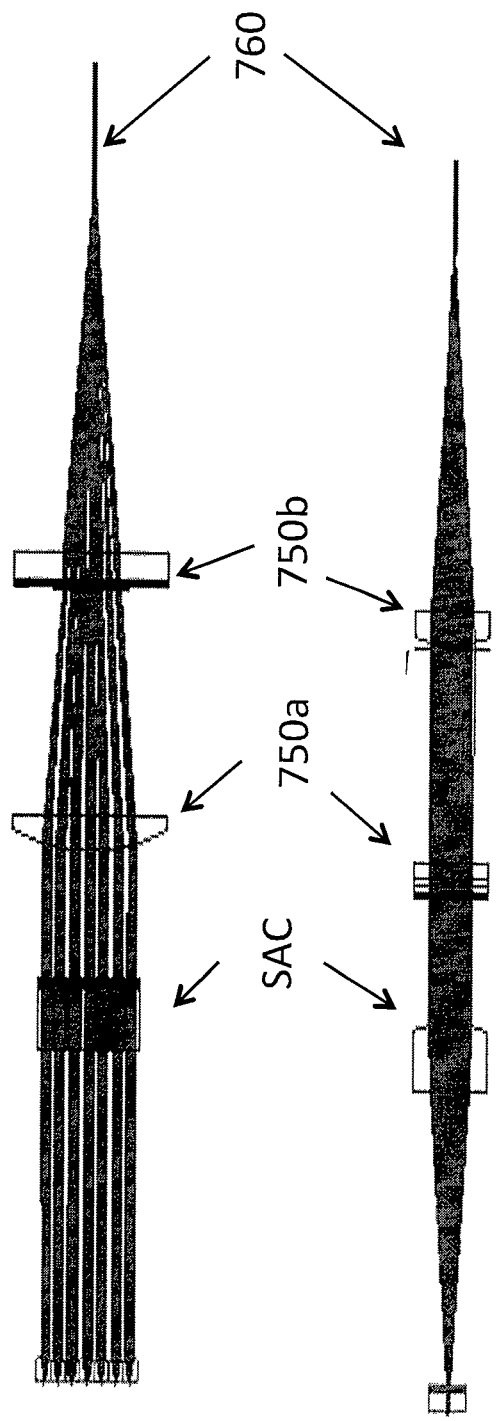
FIG. 7d is a side view (top) and top view (bottom) of the laser diode assembly illustrated in FIG. 7b, wherein the coupling lens is replaced with two lenses.

Referring to FIG. 7d, there is shown a side view (top) and top view (bottom) of the emitter assembly illustrated in FIG. 7b wherein the coupling lens 750 is replaced with first 750a and second 750b lenses. More specifically, the first and second lenses 750a, 750b are cylindrical lenses used to change the relative magnification between the x and y axis independently.

Figure 8A:
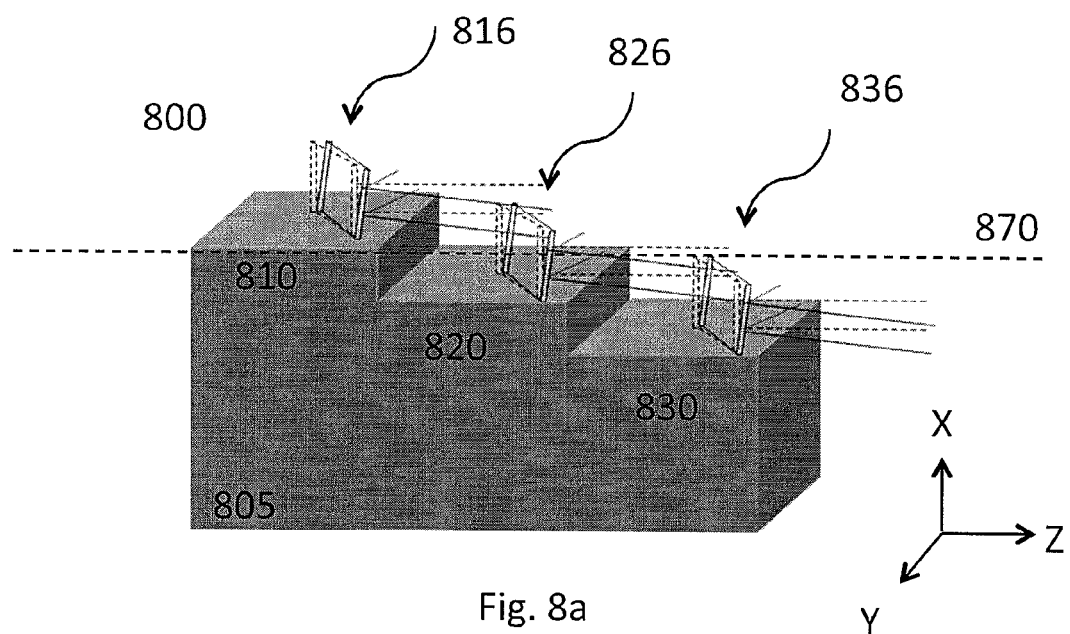
FIG. 8a is a schematic diagram of a laser diode assembly in accordance with another embodiment of the instant invention.
Figure 8B:
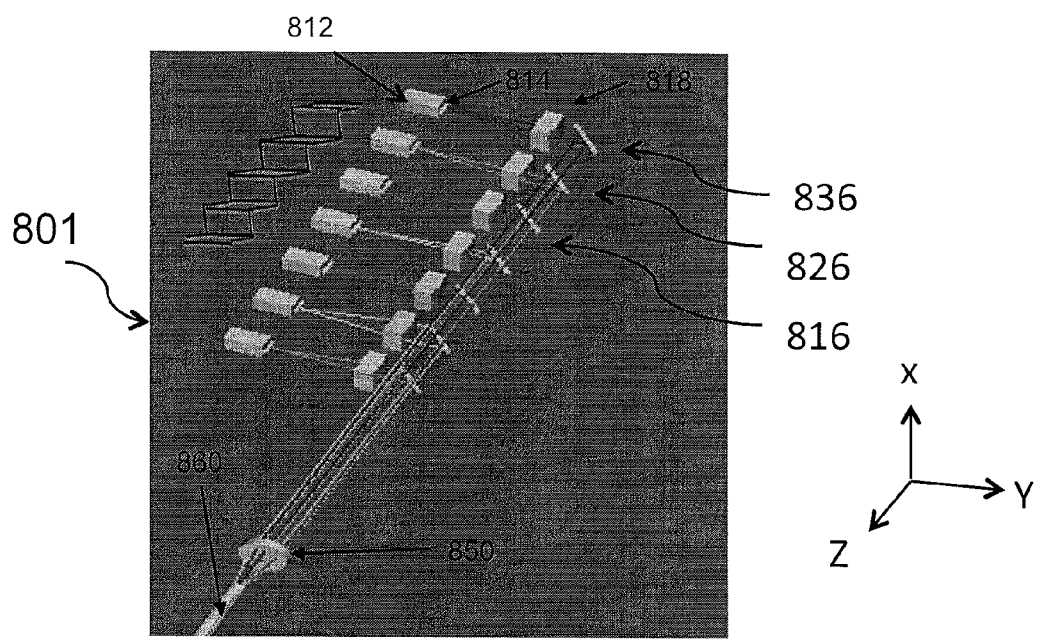
FIG. 8b is a perspective view of the laser diode assembly illustrated in FIG. 8a with a coupling lens and output port.

Referring to FIGS. 8a and 8b there is shown a schematic diagram of a laser diode assembly 800 for a spatial-multiplexed multi-emitter pump according to another embodiment of the instant invention. The assembly 800 includes a stepped support structure 805 having three steps 810, 820, 830. On each step 810, 820, 830 there is mounted a corresponding laser diode, fast axis collimator (FAC), slow axis collimator (SAC), and a turning mirror 816, 826, 836. For example, step 810 supports laser diode emitter 812, FAC 814, SAC 818, and turning mirror 816. The turning mirrors 816, 826, 836 are tilted to redirect the substantially collimated beams transmitted from the FACs and SACs at an approximately 90 degree angle towards the coupling system 850 and output port 860 (e.g., turning mirrors are tilted about the X-axis). In addition, the turning mirrors 816, 826, 836 are oriented to tilt the substantially collimated beams of light relative to the supporting surface of the package base 801 (e.g., turning mirrors are tilted about the Y-axis).

The stepped support or staircase structure 805 includes a number of steps 810, 820, 830. Each step 810, 820, and 830 has a predetermined step length L, step height t, and step width w. Optionally, the stepped support structure 805 is provided with an additional support surface and/or a cooling surface. In general, the step dimensions (e.g., t, w, L) will be determined, at least in part, on the dimensions of the laser diodes and associated connections. For example, in an embodiment using 7 laser diodes and step length L is equal to 7 mm, the step height t is equal to 0.44 mm, and the step width w is equal to 14 mm. In general, the step length L is typically between 3.0 mm and 10.0 mm, the step height t is typically between 0.2 mm and 1.0 mm, and the step width w is typically between 4.0 mm and 20.0 mm.

The emitters 812 are typically single emitter diodes formed from any suitable semiconductor material. Each emitter has an optical axis that is substantially parallel to the optical axes of the other emitters and to the axis Y. The emitters are typically disposed such that the slow axes of the emitters are parallel to the Z-axis and the fast axes are parallel to the X-axis. The emitters emit light as output beams that propagate along an optical axis parallel to the Y-axis. In this embodiment, each emitter is disposed on a separate step. Each diode is typically mounted on the support structure using a method well known in the art.

Each FAC 814 is typically a lens (e.g., a cylindrical lens) that substantially collimates the output beams from the emitters in the fast axis direction (i.e., along the x-axis), whereas each SAC 818 is typically a lens (e.g., a cylindrical lens) that substantially collimates the output beams in the slow axis direction (e.g., along the Z-axis). In this embodiment, one FAC and one SAC is provided for each emitter. In general, each lens will be mounted on the stepped support structure 805 using a method well known in the art. In general, each lens will be mounted such that its optical axis is collinear with the optical axis of the corresponding emitter.

The turning mirrors 816, 826, 836 are typically reflective mirrors used to redirect the substantially collimated beams transmitted from the FAC/SACs towards the coupling system 850 and output port 860. More specifically, each turning mirror 816, 826, 836 is tilted such that the light transmitted from the corresponding FAC and SAC is angled above or below the substantially horizontal plane that is perpendicular to the stepping direction. In particular, each turning mirror 816, 826, 836 is tilted to redirect the substantially collimated beams transmitted from the FACs and SACs at an approximately 90 degree angle towards the coupling system 850 and output port 860 (e.g., turning mirrors are tilted about the X-axis), and tilted to redirect the substantially collimated beams of light at an angle to the supporting surface of the package base 801 (e.g., turning mirrors are tilted about the Y-axis). Positioning the turning mirrors such that they are tilted about the Y-axis so that they are not parallel to the X-axis allows the collimated beams transmitted therefrom to be tilted at an angle θ relative to the optical axis of the coupling system 850. More specifically, tilting the turning mirrors causes the beams transmitted from the emitters to be transmitted to the coupling system 850 with a non-zero angle of incidence. In general, the turning mirrors will be angled to provide a tilt θ relative to the Z-axis that is between 0 and 0.6 degrees, and more typically between 0.1 and 0.4 degrees, for light beams transmitted from each emitter (e.g., the output from each emitter is angled by the same amount).

The coupling system 850 is typically a single lens such as spherical lens 750 or a relay of lenses such as cylindrical lens 750a and 750b. The coupling system converges the beams from the FACs and SACs and focuses them on the output port. In general, the coupling system will be positioned to fit the combined beam into a numerical aperture not exceeding the NA of the output port.

The output port 860 is typically the end of a waveguide, such as the end of an optical fiber. The optical fiber is typically mounted on the same package base as the coupling system 850 in a raised position so that the center of the optical fiber is offset from the optical axis of the coupling system to improve coupling efficiency (e.g., the center of each lens in the coupling system and the center of the output fiber are at different distances from the package base). In general, the optical axes of both the coupling system and the output port will be substantially parallel to the surface of the package base on which they are mounted.

Figure 9:
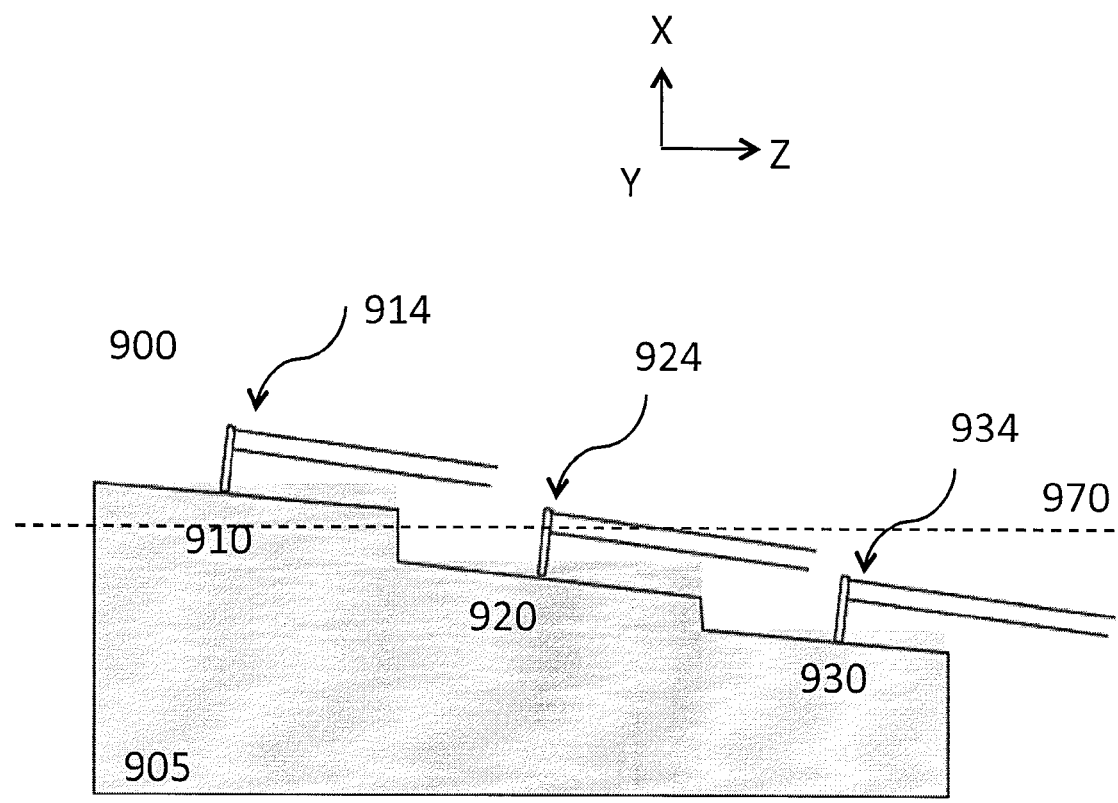
FIG. 9 is a schematic diagram of a laser diode assembly in accordance with another embodiment of the instant invention.

Referring to FIG. 9 there is shown a schematic diagram of a laser diode assembly 900 for a spatial-multiplexed multi-emitter pump according to yet another embodiment of the instant invention. The assembly 900 includes a stepped support structure 905 having three steps 910, 920, 930. On each step 910, 920, 930 there is mounted a corresponding laser diode (not shown, but similar to 712, 722, 732) and a fast axis collimating lens (FAC) 914, 924, 934. Optionally, a slow axis collimator (SAC) (not shown) is also mounted on each step (i.e., either before or after the FAC, but typically after). The FACs 914, 924, 934 substantially collimate the beams transmitted from the emitters and transmitted the collimated beams at an angle to the system optical axis 970. The tilted collimated beams are then redirected by the coupling lens (not shown) and transmitted to the output port (not shown).

The stepped support or staircase structure 905 includes a number of steps 910, 920, 930. Each step 910, 920, and 930 has a predetermined step length L, step height t, and step width w. Optionally, the stepped support structure 905 is provided with an additional support surface and/or a cooling surface. In general, the step dimensions (e.g., t, w, L) will be determined, at least in part, on the dimensions of the laser diodes and associated connections. For example, in an embodiment using 7 laser diodes and step length L is equal to 7 mm, the step height t is equal to 0.44 mm, and the step width w is equal to 14 mm. In general, the step length L is typically between 3.0 mm and 10.0 mm, the step height t is typically between 0.2 mm and 1.0 mm, and the step width w is typically between 4.0 mm and 20.0 mm. Each step 910, 920, and 930 is angled relative to the Z axis (e.g., machined so that it is angled relative to the main optical bench). For example, in one embodiment the step incline is about 0.2 degrees. In another embodiment, the step incline is about 0.5 degrees.

The emitters (not shown) are typically single-emitter diodes formed from any suitable semiconductor material. Each emitter has an optical axis that is substantially parallel to the optical axes of the other emitters and parallel to the surface of the corresponding step (e.g., at an angle to the Z axis). More specifically, the emitters are typically disposed such that the slow axes of the emitters are parallel to the Y-axis and the fast axes are substantially parallel to the x-axis (i.e, at a small axis to the X-axis). The emitters emit light as output beams that propagate along an optical axis angled relative to the Z-axis. In this embodiment, each emitter is disposed on a separate step. Each diode is typically mounted on the support structure using a method well known in the art.

The fast axis collimators (FAC) 914, 924, 934 are typically lenses (e.g., cylindrical lenses) that substantially collimate the output beams from the emitters in the fast axis direction. In this embodiment, one FAC is provided for each emitter. In general, each lens will be mounted on the stepped support structure 905 using a method well known in the art. More specifically, each lens 914, 924, 934 will be mounted such that its optical axis is parallel to the optical axis of the corresponding emitters. Positioning the FAC lenses such the optical axes thereof are parallel to the surface of the inclined steps results in the collimated beams transmitted therefrom being tilted at an angle θ relative to the propagation axis (e.g., Z-axis). More specifically, mounting the emitters, SACs, and FACs on the inclined steps causes the beams transmitted from the FACs to be transmitted to the coupling lens with a non-zero angle of incidence. In general, the steps will be inclined to provide a tilt θ relative to the Z-axis that is between 0 and 0.6 degrees, and more typically between 0.1 and 0.4 degrees, for light beams transmitted from each emitter (e.g., the output from each emitter is angled by the same amount).

The coupling lens (not shown) is typically a focussing lens having a focal length f. For example, in one embodiment the coupling lens is a single spherical lens. In other embodiments, the single coupling lens is replaced with two cylindrical lenses. In general, the single coupling lens will be disposed about one focal length f away from the output port, and generally, will be positioned to fit the combined beam into a numerical aperture not exceeding the NA of the output port.

The output port (not shown) is typically the end of a waveguide, such as the end of an optical fiber. The optical fiber is typically mounted on the same optical bench as the coupling lens in a raised position so that the center of the optical fiber is offset from the optical axis of the lens to improve coupling efficiency (e.g., the center of the coupling lens and the center of the output fiber are at different distances from the optical bench). In general, the optical axes of both the coupling lens and the output port will be substantially parallel to the surface of the optical bench on which they are mounted.

Advantageously, the embodiments illustrated in FIGS. 7a/7b and FIG. 8a are relatively easy to manufacture, whereas the embodiments illustrated in FIGS. 8a and 9 obviate light being transmitted through the FACs off axis.

In each of the above embodiments, tilting the diode emission advantageously does not change the relative spacing to the focusing lens, due to the step configuration, and thus has negligible impact on the CE.

In addition, in each of the above embodiments, tilting the individual output beams relative to package base advantageously provides a tunable effective step height that is dependent on the angle of the tilt. Accordingly, the CE is optimized by the configuration of the optics mounted to the package base, rather than with the design of the package base. Accordingly, the same package base can be used to provide a high-brightness spatial-multiplexed multi-emitter pump with good CE. In contrast, prior art pumps typically arrange the individual output beams to be parallel to the package base and the output fiber (i.e., normal to the input surface), thus limiting the coupling efficiency.

In each of the above embodiments one emitter is provided on each step. In other embodiments of the instant invention, more than one emitter is provided on each step. For example, in one embodiment, a laser bar is provided on each step. In embodiments where more than one emitter is provided on each step, the FACs and/or SACs are arranged as a lens array (e.g., so each emitter has its own corresponding FAC/SAC, or alternatively, one collimating lens (e.g., a larger cylindrical lens) is provided on each step such that each emitter on the same step is collimated with the same cylindrical lens. In embodiments, where the FACs are offset to provide the beam tilting, the single FAC is will be offset in the stepping direction (e.g., the optical axis of the FAC will be above or below the optical axes of the corresponding emitters on that step.

Figure 10:
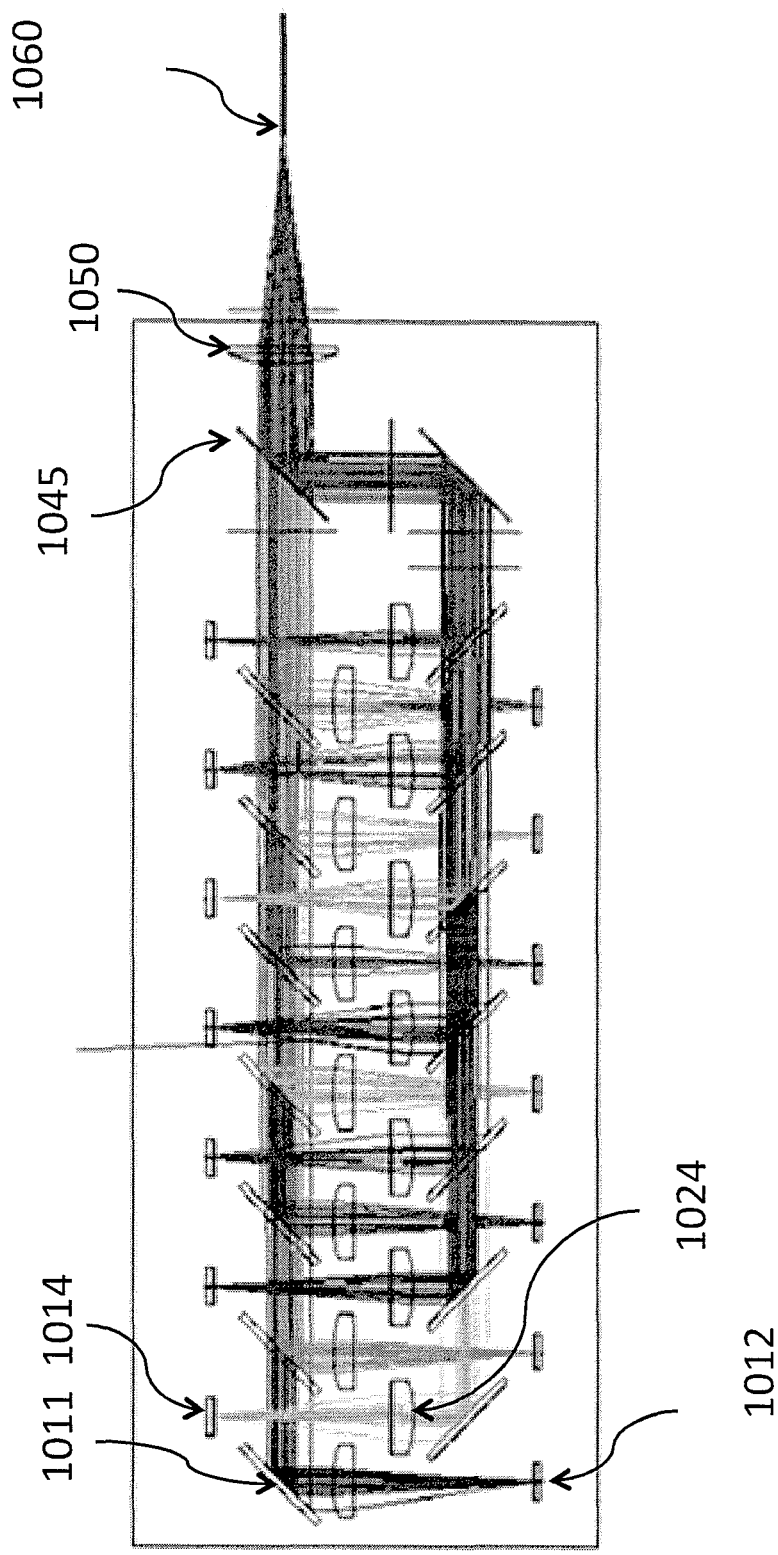
FIG. 10 is a schematic diagram of a multi-emitter pump in accordance with one embodiment of the instant invention.

Referring to FIG. 10, there is shown an embodiment wherein two emitters are provided on each step. The laser diode assembly includes a stepped support structure (not shown for illustrative purposes), which supports a plurality of laser diode emitters (e.g., 1012, 1014), a plurality of FACs (e.g., 1024), and a plurality of turning mirrors (e.g., 1011). More specifically, each step of the support structure supports two laser diode emitters (e.g., 1012, 1014) and the corresponding FACs (e.g., 1024) and turning mirrors (e.g., 1011). The turning mirrors redirect the substantially collimated beams to the beam combiner 1045, coupling lens 1050, and output port 1060.

The emitters 1012 are typically single-emitter diodes formed from any suitable semiconductor material mounted on the support structure using a method well known in the art. The FACs 1014 are typically lenses (e.g., cylindrical lenses) that substantially collimate the output beams from the emitters in the fast axis direction. In general, each FAC will be mounted on the stepped support structure using a method well known in the art. More specifically, each FAC will be mounted such that its optical axis is offset in the fast axis direction (i.e., which is also the stepping direction in this embodiment). For example, in this embodiment each FAC is offset so that it is not coaxial with the optical axis of the corresponding emitter. In other words, the FACs provide the beam tilting and the turning mirrors (e.g., 1011) are provided only to redirect the tilted beams of light towards the beam combiner.

Of course, the above embodiments have been provided as examples only. It will be appreciated by those of ordinary skill in the art that various modifications, alternate configurations, and/or equivalents will be employed without departing from the spirit and scope of the invention. Accordingly, the scope of the invention is therefore intended to be limited solely by the scope of the appended claims.

The invention claimed is:

1. A multi-emitter pump comprising:
    a package base;
    a laser diode assembly supported on the package base, the laser diode assembly including a stepped support structure including first, second, and third steps, the first step supporting a first laser diode emitter and a first collimating lens, the second step supporting a second laser diode emitter and a second collimating lens, the third step supporting a third laser diode emitter and a third collimating lens; and
    at least one coupling lens mounted on the package base for directing collimated light transmitted from the laser diode assembly to an output port;
    wherein the laser diode assembly is arranged to transmit beams of light emitted from each of the first, second, and third laser diode emitters to the at least one coupling lens as tilted collimated beams of light that are incident on the at least one coupling lens with a non-zero angle of incidence, each of the tilted collimated beams of light having the same tilt angle relative to a supporting surface of the package base.

2. The multi-emitter pump according to claim 1, wherein the at least one coupling lens is mounted on the package base such that an optical axis of the at least one coupling lens is parallel to the supporting surface of the package base, and wherein each of the first, second, and third steps has an effective step height that is dependent on the tilt angle.

3. The multi-emitter pump according to claim 2, wherein the first collimating lens comprises a first fast axis collimator, the second collimating lens comprises a second fast axis collimator, and the third collimating lens comprises a third fast axis collimator, and wherein the multi-emitter pump further comprises a first slow axis collimator disposed on the first step, second slow axis collimator disposed on the second step, and a third slow axis collimator disposed on the third step.

4. The multi-emitter pump according to claim 1, wherein the first collimating lens comprises a first fast axis collimator, the second collimating lens comprises a second fast axis collimator, and the third collimating lens comprises a third fast axis collimator, and comprising a first slow axis collimator disposed on the first step, a second slow axis collimator disposed on the second step, and a third slow axis collimator disposed on the third step.

5. The multi-emitter pump according to claim 3, wherein an optical axis of the first laser diode emitter is parallel to the supporting surface of the package base, and wherein the optical axis of the first fast axis collimator is parallel to the supporting surface of the package base.

6. A multi-emitter pump comprising:
a package base;
a laser diode assembly supported on the package base, the laser diode assembly including a stepped support structure including first and second steps, the first step supporting a first laser diode emitter and at least one collimating lens, the second step supporting a second laser diode emitter and at least one other collimating lens; and
at least one coupling lens mounted on the package base for directing collimated light transmitted from the laser diode assembly to an output port;
wherein the laser diode assembly is for transmitting tilted collimated beams of light to the at least one coupling lens such that the tilted collimated beams of light are incident on the at least one coupling lens with a non-zero angle of incidence,
wherein the at least one coupling lens is mounted on the package base such that an optical axis of the at least one coupling lens is parallel to a supporting surface of the package base,
wherein the tilted collimated beams are at an angle to the supporting surface of the package base,
wherein the at least one collimating lens comprises a first fast axis collimator and a first slow axis collimator disposed on the first step, and a second fast axis collimator and a second slow axis collimator disposed on the second step,
wherein an optical axis of the first laser diode emitter is parallel to the supporting surface of the package base,
wherein the optical axis of the first fast axis collimator is parallel to the supporting surface of the package base, and
wherein there is an offset between the optical axis of the first laser diode emitter and the first fast axis collimator such that the first fast axis collimator directs beams of light incident thereon at an angle to the supporting surface of the package base to provide the tilted collimated beams of light.

7. The multi-emitter pump according to claim 4, wherein the first fast axis collimator is shifted in a direction parallel to the fast axis of the first laser diode by an amount determined to tilt a beam of light emitted from the first laser diode emitter at an acute angle from the optical axis of the first laser diode, and wherein each of the second fast axis collimator and third fast axis collimator is translated in the direction parallel to the fast axis of the first laser diode by the amount determined to tilt the beam of light emitted from the first laser diode emitter.

8. The multi-emitter pump according to claim 5, comprising a first turning mirror disposed on the first step, a second turning mirror disposed on the second step, and a third turning mirror disposed on the third step, each of the first, second, and third turning mirrors oriented to direct beams of light incident thereon at the angle to the supporting surface of the package base.

9. The multi-emitter pump according to claim 4, comprising a first turning mirror disposed on the first step, a second turning mirror disposed on the second step, and a third turning mirror disposed on the third step, each of the first, second, and third turning mirrors oriented for providing the non-zero angle of incidence.

10. The multi-emitter pump according to claim 3, wherein each of the first, second and third steps is inclined relative to the supporting surface of the package base such that the tilted collimated beams of light are transmitted at a non-zero angle relative to the supporting surface of the package base.

11. The multi-emitter pump according to claim 10, wherein the optical axis of the first laser diode emitter and the optical axis of the first fast axis collimator are at the non-zero angle relative to the supporting surface of the package base.

12. The multi-emitter pump according to claim 3, wherein the at least one coupling lens comprises a single spherical lens.

13. The multi-emitter pump according to claim 3, wherein the at least one coupling lens comprises first and second cylindrical lenses, and wherein an optical axis of the first cylindrical lens and an optical axis of the second cylindrical lens are substantially parallel to the supporting surface of the package base.

14. The multi-emitter pump according to claim 3, wherein each of the first fast axis collimator, the first slow axis collimator, the second fast axis collimator, the second slow axis collimator, the third fast axis collimator, and the third slow axis collimator is a cylindrical lens.

15. A method of providing a multi-emitter pump comprising:
providing a laser diode assembly on a package base, the laser diode assembly including a stepped support structure having first, second, and third steps, the first step supporting a first laser diode emitter and a first collimating lens, the second step supporting a second laser diode emitter and a second collimating lens, the third step supporting a third laser diode emitter and a third collimating lens; and
mounting at least one coupling lens on the package base, the at least one coupling lens for directing collimated light transmitted from the laser diode assembly to an output port;
wherein the laser diode assembly is arranged to transmit beams of light emitted from each of the first, second, and third laser diode emitters to the at least one coupling lens as tilted collimated beams of light that are incident on the at least one coupling lens with a non-zero angle of incidence, each of the tilted collimated beams of light having the same tilt angle relative to a supporting surface of the package base.

16. The method according to claim 15, wherein each of the first, second, and third steps have a predetermined physical step height, and wherein prior to supporting the laser diode assembly on the package base, a configuration of the laser diode assembly is selected to provide a predetermined effective step height for the first, second, and third steps, the effective step height different from the physical step height.

17. The method according to claim 16, wherein the effective step height is tuned by varying the non-zero angle of incidence.

18. The method according to claim 16, wherein the effective step height is predetermined to improve the coupling efficiency.

19. The method according to claim 16, wherein the effective step height is predetermined in dependence upon a number of emitters in the laser diode assembly.

20. A multi-emitter pump comprising:
a package base;
a laser diode assembly supported on the package base, the laser diode assembly including a stepped support structure including first, second, and third steps, the first step supporting a first laser diode emitter and a first collimating lens, the second step supporting a second laser diode emitter and a second collimating lens, the third step supporting a third laser diode emitter and a third collimating lens; and at least one coupling lens mounted on the package base for directing collimated light transmitted from the laser diode assembly to an output port;

wherein the laser diode assembly is arranged to transmit beams of light emitted from each of the first, second, and third laser diode emitters to the at least one coupling lens as tilted collimated beams of light that are at an angle to a plane perpendicular to the stepping direction of the stepped support structure, each of the tilted collimated beams of light having the same tilt angle relative to a supporting surface of the package base.

21. The multi-emitter pump according to claim 1, wherein each of the first, second, and third steps has a predetermined physical step height and a predetermined effective step height, the predetermined effective step height different from the predetermined physical step height, the predetermined effective step height dependent on the tilt angle.

22. The multi-emitter pump according to claim 1, wherein laser diode assembly comprises a first laser diode bar including the first laser diode emitter supported on the first step, a second laser diode bar including the second laser diode emitter supported on the second step, a third laser diode bar including the third laser diode emitter supported on the third step, and wherein the tilted collimated beams of light transmitted from the laser diode assembly to the at least one coupling lens comprise a first beam of light transmitted from the first laser diode bar, a second beam of light transmitted from the second laser diode bar, and a third beam of light transmitted from the third laser diode bar, the first, second, and third beams of light incident on the at least one coupling lens at a same angle.

23. The multi-emitter pump according to claim 1, wherein laser diode assembly comprises a first laser diode bar including the first laser diode emitter supported on the first step, a second laser diode bar including the second laser diode emitter supported on the second step, and a third laser diode bar including the third laser diode emitter supported on the third step, and wherein the beam from each emitter of the first, second, and third laser diode bars is angled downwards by a same fixed angle $\theta$ relative to a plane perpendicular to the stepping direction of the stepped support structure.

24. The multi-emitter pump according to claim 1, wherein the first laser diode emitter is oriented relative to one of the first collimator lens and a first turning mirror so as to provide the non-zero angle of incidence, the non-zero angle of incidence dependent upon a number of stacked laser diode emitters.

25. The multi-emitter pump according to claim 1, wherein the non-zero angle of incidence is dependent upon a number of stacked laser diode emitters.

* * * * *